US009728695B2

(12) United States Patent
Takehara et al.

(10) Patent No.: US 9,728,695 B2
(45) Date of Patent: Aug. 8, 2017

(54) MOUNT SUBSTRATE AND LED MODULE WITH THE SAME

(71) Applicant: Panasonic Intellectual Property Management Co., Ltd., Osaka (JP)

(72) Inventors: Kosuke Takehara, Osaka (JP); Hisaki Fujitani, Kyoto (JP); Naoki Tagami, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/012,133

(22) Filed: Feb. 1, 2016

(65) Prior Publication Data
US 2016/0260878 A1    Sep. 8, 2016

(30) Foreign Application Priority Data

Mar. 4, 2015    (JP) .................................. 2015-042725

(51) Int. Cl.
*H01L 33/62* (2010.01)
*H01L 33/60* (2010.01)
(Continued)

(52) U.S. Cl.
CPC .............. *H01L 33/62* (2013.01); *H01L 33/50* (2013.01); *H01L 33/505* (2013.01); *H01L 33/52* (2013.01);
(Continued)

(58) Field of Classification Search
CPC ......... H01L 33/62; H01L 33/50; H01L 33/60; H01L 33/505; H01L 33/52;
(Continued)

(56) References Cited

U.S. PATENT DOCUMENTS

2002/0003048 A1*  1/2002  Chikama ........... G02F 1/136286
                                                        174/256
2008/0055901 A1*  3/2008  Sanpei ..................... F21K 9/00
                                                        362/235

(Continued)

FOREIGN PATENT DOCUMENTS

| JP | 2008-140934 A | 6/2008 |
| JP | 2011-066267 A | 3/2011 |
| JP | 2012-124358 A | 6/2012 |
| JP | 2014-103293 A | 6/2014 |
| JP | 2014-146685 A | 8/2014 |
| JP | 2014-170947 A | 9/2014 |
| JP | 2014-197606 A | 10/2014 |

*Primary Examiner* — Steven Loke
*Assistant Examiner* — Juanita Rhodes
(74) *Attorney, Agent, or Firm* — McDermott Will & Emery LLP

(57) ABSTRACT

A mount substrate includes: an insulation substrate containing resin and glass; connection conductors formed on a surface of the insulation substrate; a first white resist layer that covers the connection conductors; and a second white resist layer that covers the first white resist. Each of the connection conductors includes a copper foil and a plating layer partly formed on the copper foil. The plating layer is formed of metal having oxidation-resistant and corrosion-resistant characteristics higher than those of copper. The first white resist layer is formed with first openings that respectively expose the plating layers of the connection conductors. The second white resist layer covers a periphery of each plating layer of the connection conductors in planar view.

6 Claims, 4 Drawing Sheets

(51) Int. Cl.
*H01L 33/50* (2010.01)
*H01L 33/52* (2010.01)
*H05K 1/02* (2006.01)

(52) U.S. Cl.
CPC .... *H01L 33/60* (2013.01); *H01L 2224/45144* (2013.01); *H01L 2224/48091* (2013.01); *H01L 2224/49107* (2013.01); *H01L 2224/73265* (2013.01); *H05K 1/0274* (2013.01); *H05K 2201/0195* (2013.01); *H05K 2201/10106* (2013.01)

(58) Field of Classification Search
CPC . H01L 2224/73265; H01L 2224/48091; H01L 2224/49107; H01L 2924/00014; H05K 2201/0195; H05K 1/0274; H05K 2201/10106
See application file for complete search history.

(56) References Cited

U.S. PATENT DOCUMENTS

| | | | |
|---|---|---|---|
| 2012/0138990 A1* | 6/2012 | Sato | H01L 33/641 257/98 |
| 2013/0106279 A1* | 5/2013 | Hayashida | H01L 25/0753 313/512 |
| 2014/0042900 A1* | 2/2014 | Hotta | H01L 33/60 313/512 |
| 2014/0264417 A1* | 9/2014 | Kobayashi | H01L 33/62 257/98 |
| 2014/0309356 A1* | 10/2014 | Kim | C08K 3/0033 524/497 |
| 2015/0313009 A1* | 10/2015 | Markham | H05K 1/0298 174/251 |

* cited by examiner

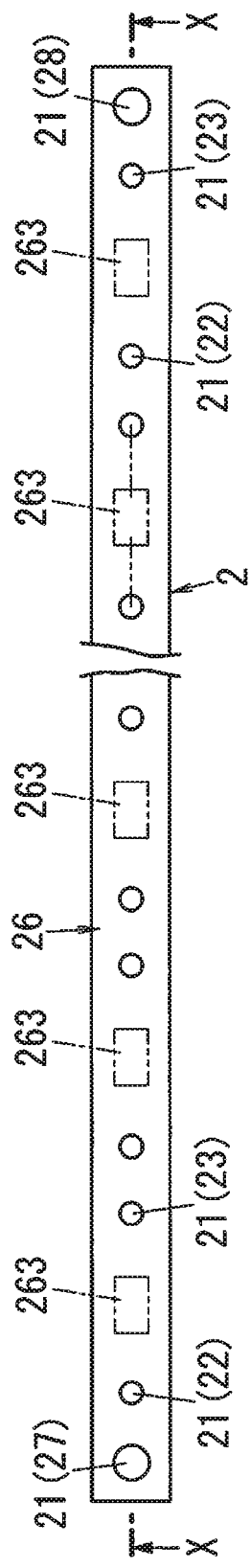
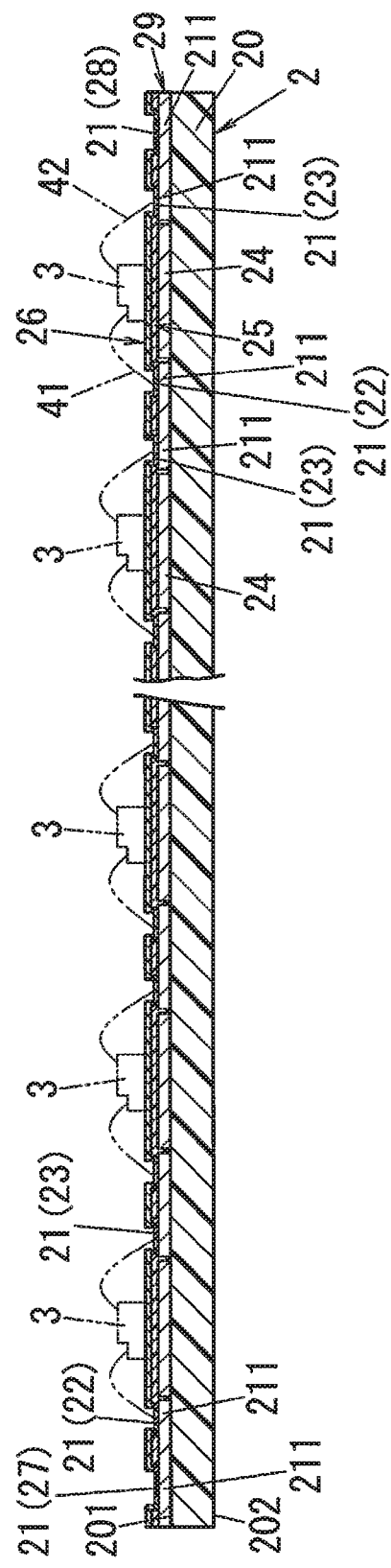
FIG. 1A
FIG. 1B

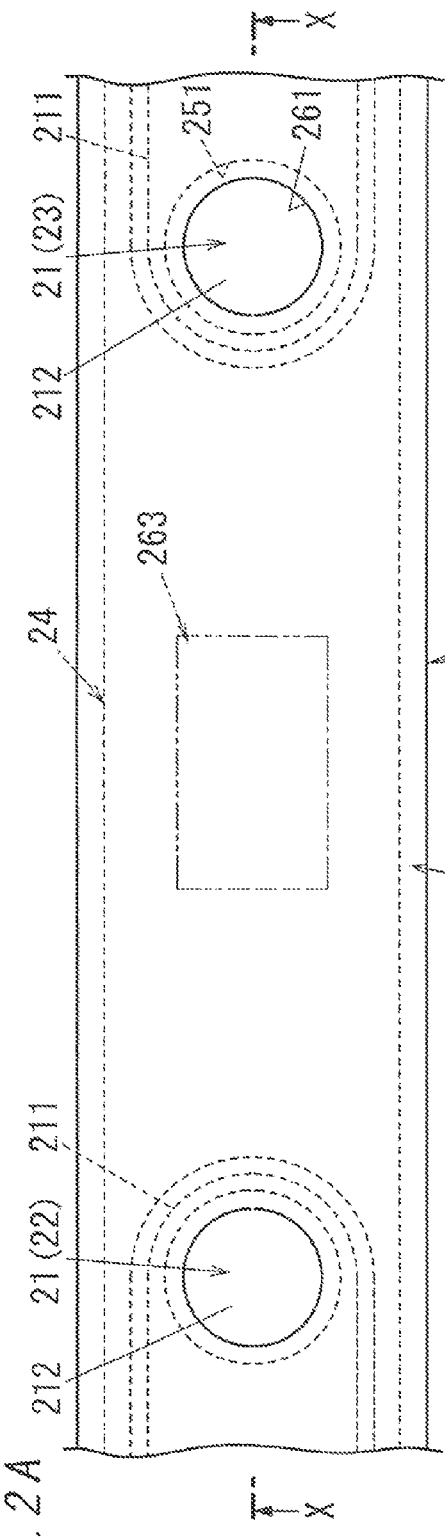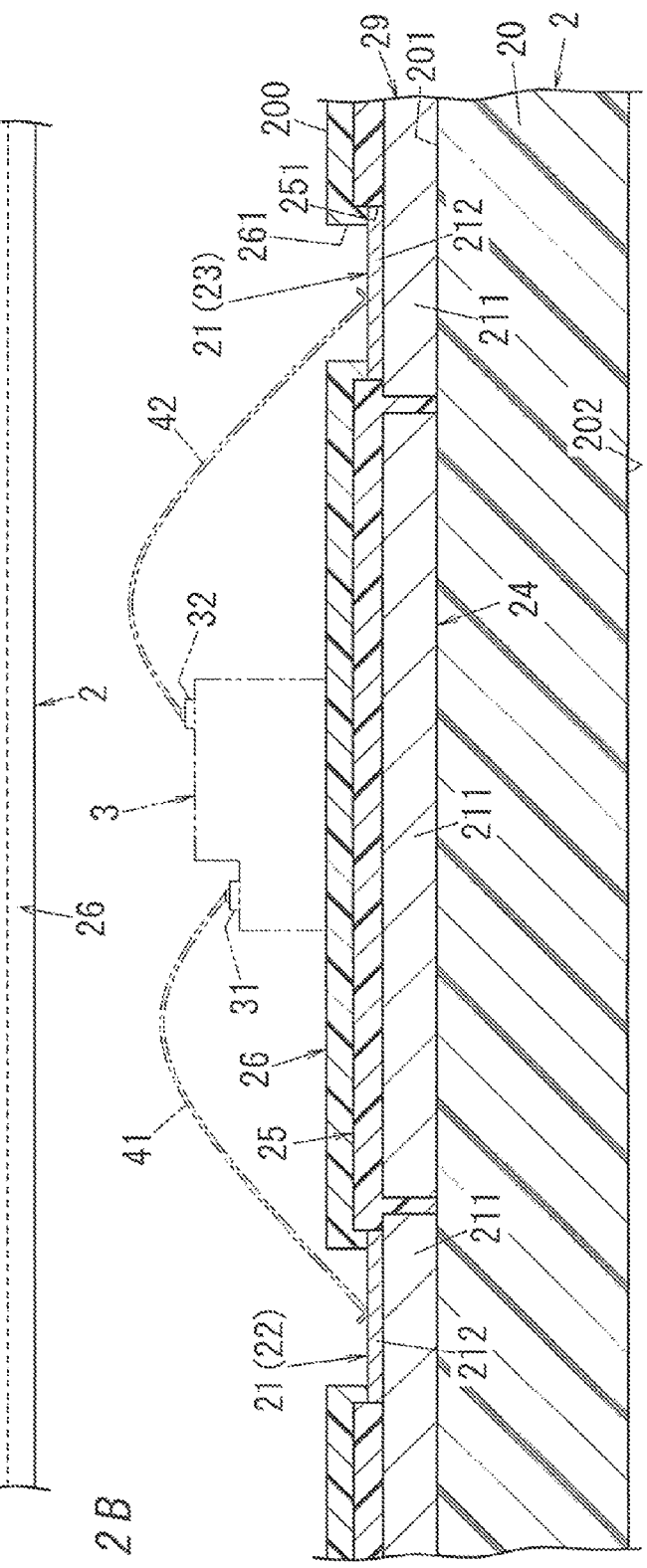

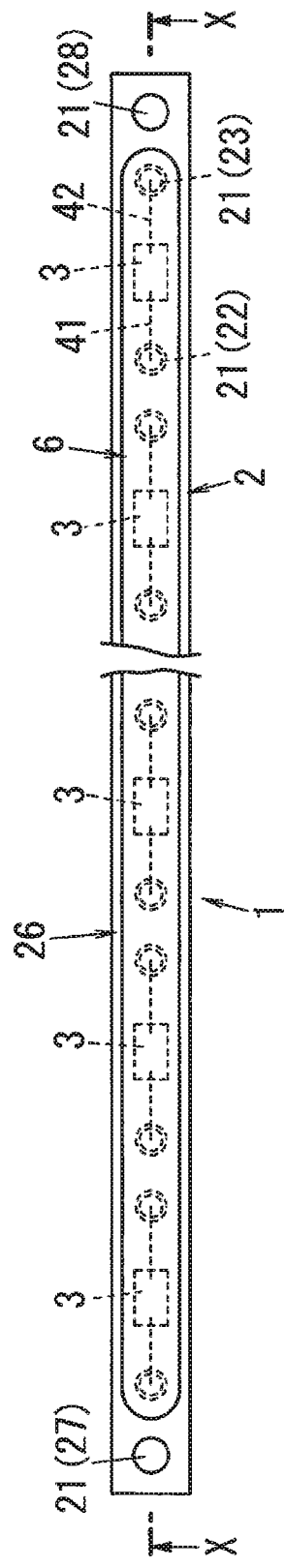
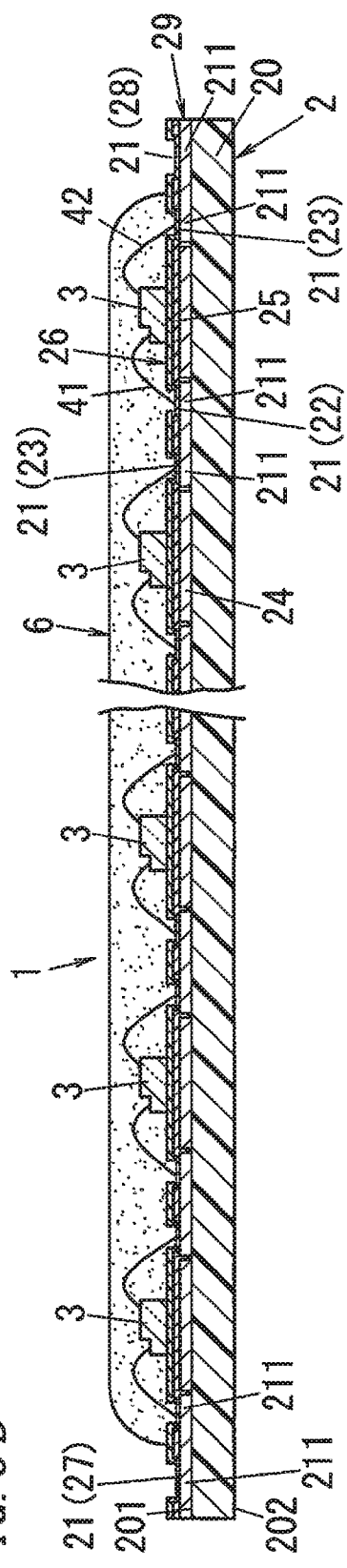
FIG. 3A
FIG. 3B

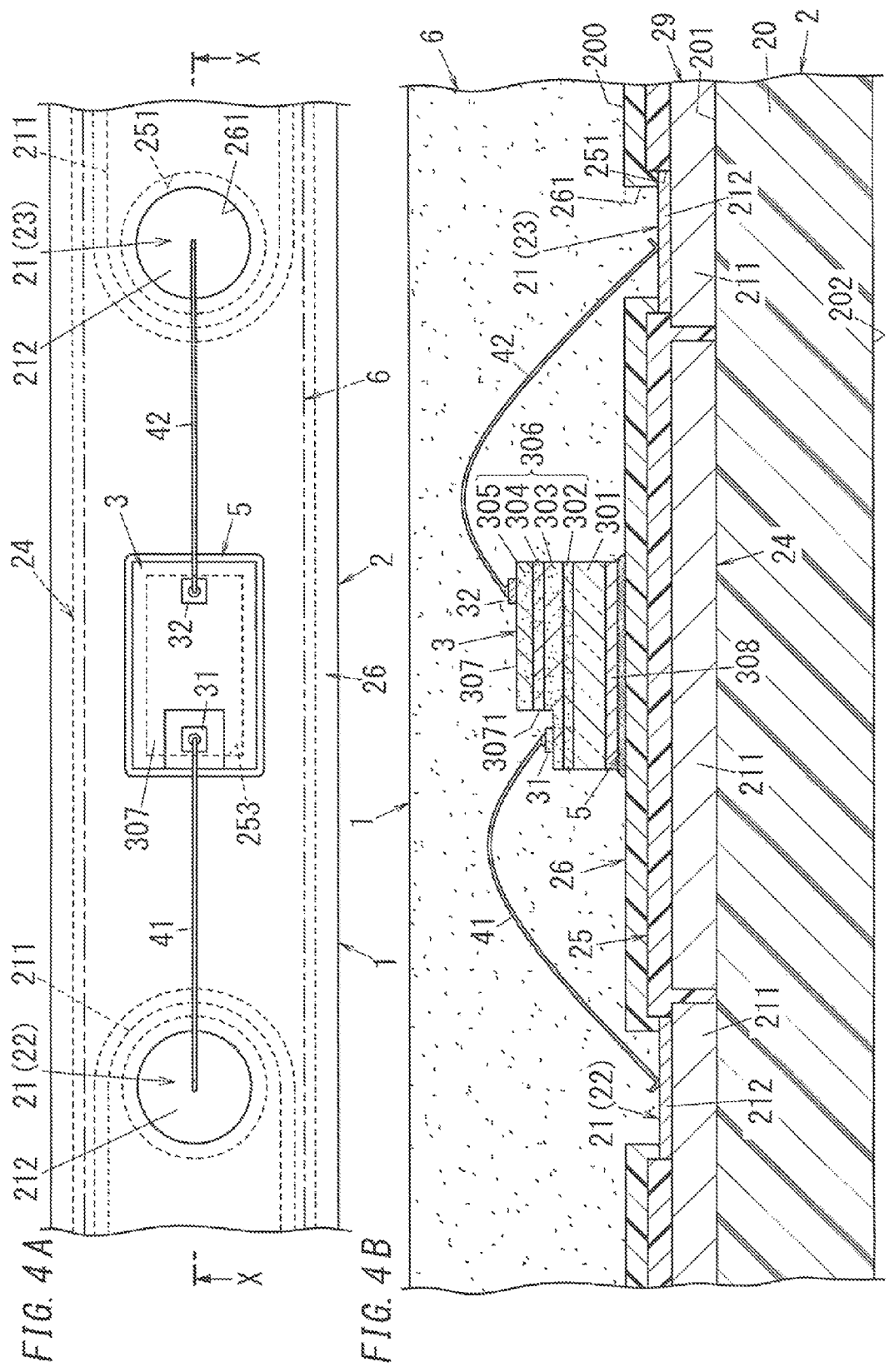

MOUNT SUBSTRATE AND LED MODULE WITH THE SAME

CROSS REFERENCE TO RELATED APPLICATIONS

This application claims the benefit and priority of Japanese Patent Application No. 2015-042725, filed on Mar. 4, 2015, the entire contents of which are incorporated herein by reference.

TECHNICAL FIELD

The disclosure relates to mount substrates and LED (Light Emitting Diode) modules with the same and, more particularly, to a mount substrate which allows LED chips to be mounted on, and a COB (Chip On Board) LED module with the same.

BACKGROUND ART

COB LED modules have so far been known as LED modules (see JP Pub. No. 2014-170947 (hereinafter referred to as "Document 1") and JP Pub. No. 2008-140934 (hereinafter referred to as "Document 2")).

A COB LED module described in Document 1 includes, for example, a resin substrate, LED chips mounted on a first main surface of the resin substrate, metal lines, electrode terminals, a resist (an electric insulation coating), and sealing members formed of resin containing phosphor. The metal lines are patterned on the first main surface of the resin substrate. Examples of metal material of the metal lines include copper and the like. The resist is formed over the whole of the first main surface of the resin substrate except for metal lines on junctions of the LED chips and the electrode terminals. The resist is formed of white resin material.

A COB LED module described in Document 2 includes a device substrate, a white reflection layer deposited on the whole surface of the device substrate, a circuit pattern formed on the reflection layer, and LED chips. The LED chips are adhered to the white reflection layer with an adhesion layer. The circuit pattern is formed of copper foil.

In a mount substrate which allows LED chips to be mounted on, and a COB LED module with the same, there is a concern about reduction in reliability owing to oxidation or corrosion of copper in a case where components formed of copper are included like Documents 1 and 2.

SUMMARY

It is an object of the disclosure to provide a mount substrate and an LED module with the same, capable of improving reliability thereof.

A mount substrate according to an aspect is configured to allow (at least) an LED chip to be mounted on. The mount substrate includes: an insulation substrate containing resin and glass; connection conductors formed on a surface of the insulation substrate; a first white resist layer that covers the connection conductors; and a second white resist layer that covers the first white resist. Each of the connection conductors includes a copper foil and a plating layer partly formed on the copper foil. The plating layer is formed of metal having oxidation-resistant and corrosion-resistant characteristics higher than those of copper. The first white resist layer is formed with first openings that respectively expose the plating layers of the connection conductors. The second white resist layer covers a periphery of each plating layer of the connection conductors in planar view.

An LED module includes the mount substrate, and the LED chip mounted on the mount substrate. The LED chip includes first and second electrodes. The first and second electrodes are disposed on a side of a first surface, in a thickness direction, of the LED chip. The LED chip is adhered to the mount substrate via an adhesion layer so that a second surface, in the thickness direction, of the LED chip is at a side of the second white resist layer of the mount substrate. The first electrode is electrically connected, via a first wire, to a first connection conductor of the connection conductors of the mount substrate. The second electrode is electrically connected, via a second wire, to a second connection conductor of the connection conductors of the mount substrate.

With the mount substrate, reliability thereof can be improved.

With the LED module, reliability thereof can be improved.

BRIEF DESCRIPTION OF THE DRAWINGS

The figures depict one or more implementations in accordance with the present teaching, by way of example only, not by way of limitations. In the figure, like reference numerals refer to the same or similar elements where:

FIG. 1A is a schematic plan view of a mount substrate in Embodiment 1, and FIG. 1B is a schematic sectional view taken along an X-X line in FIG. 1A;

FIG. 2A is a schematic plan view showing related part of the mount substrate in Embodiment 1, and FIG. 2B is a schematic sectional view taken along an X-X line in FIG. 2A;

FIG. 3A is a schematic plan view of LED modules in Embodiment 1, and FIG. 3B is a schematic sectional view taken along an X-X line in FIG. 3A; and FIG. 4A is a schematic plan view showing related part of an LED module in Embodiment 1, and FIG. 4B is a schematic sectional view taken along an X-X line in FIG. 4A.

DETAILED DESCRIPTION

Each figure to be explained in embodiments below is a schematic diagram, and a ratio of each size of components does not necessarily represent actual size proportion.

Hereinafter, a mount substrate 2 of an embodiment will be explained with reference to FIGS. 1A, 1B, 2A and 2B, and an LED module 1 with the mount substrate 2 will be explained with reference to FIGS. 3A, 3B, 4A and 4B.

The mount substrate 2 is configured to allow (at least) an LED chip 3 to be mounted on. The mount substrate 2 includes an insulation substrate 20 containing resin and glass; connection conductors 21 formed on a surface 201 of the insulation substrate 20; a first white resist layer 25 that covers the connection conductors 21; and a second white resist layer 26 that covers the first white resist 25. Each of the connection conductors 21 includes a copper foil 211 and a plating layer 212 partly formed on the copper foil 211. The plating layer 212 is formed of metal having oxidation-resistant and corrosion-resistant characteristics higher than those of copper. The first white resist layer 25 is formed with first openings 251 that respectively expose the plating layers 212 of the connection conductors 21. The second white resist layer 26 covers a periphery of each plating layer 212 of the connection conductors 21 in planar view. With the configuration described above, the reliability of the mount substrate 2 can be improved.

In the embodiment, the insulation substrate 20 is a substrate having electric insulation. The first white resist layer 25 has a function as an electric insulation cover that covers each of the connection conductors 21, and a function as a reflection layer configured to reflect visible light. The above "in planar view" means a shape seen from a side of a surface of the second white resist layer 26 in a thickness direction of the insulation substrate 20. FIGS. 1A and 2A schematically show, on the surface of the second white resist layer 26, chip mounted regions 263 which allow respective LED chips 3 to be mounted on. FIG. 1B schematically shows an LED chip 3 to be mounted on the mount substrate 2.

The present inventors thought up forming a gold-plating layer on part, connected with each LED chip, of metal lines made of copper in the COB LED module described in Document 1, thereby improving the reliability. The present inventors have acquired knowledge on part of the metal lines being exposed as a result of a shape of an inner wall of an opening for exposing each connection part in the resist formed of white resin material, or occurrence of cut of a periphery of each opening in the resist.

Each component of the mount substrate 2 in the embodiment will be hereinafter explained in details, but the mount substrate 2 will be explained after explanation of an example of the LED chip 3 as a matter of convenience.

In the embodiment, the LED chip 3 is a blue LED configured to emit blue light. The LED chip 3 is a GaN blue LED chip, and as shown in an example of FIG. 4B includes a substrate 301, a buffer layer 302, an n-type semiconductor layer 303, a light-emitting layer 304 and a p-type semiconductor layer 305. The GaN blue LED chip is a nitride semiconductor light-emitting device with the light-emitting layer 304 of which semiconductor material is GaN material. Examples of the GaN material include GaN, AlGaN, InGaN and the like. The substrate 301 is a sapphire substrate. Preferably the LED chip 3 has emission spectrum in which a main emission peak has a wavelength in a wavelength region of 440 nm to 480 nm.

In the example of FIG. 4B, a multilayer 306 of the LED chip 3 includes the buffer layer 302, the n-type semiconductor layer 303, the light-emitting layer 304 and the p-type semiconductor layer 305, and is formed on a surface of the substrate 301. The LED chip 3 is etched from a surface side of the multilayer 306 (a surface side of the p-type semiconductor layer 305) to an intermediate position in the n-type semiconductor layer 303, whereby part of the multilayer 306 is removed. In short, the LED chip 3 has mesa structure 307 formed by etching the part of the multilayer 306. As a result, the LED chip 3 has a step (a difference in level) 3071 between the surface of the p-type semiconductor layer 305 and an exposed surface of the n-type semiconductor layer 303. The LED chip 3 is formed with a first electrode 31 on the exposed surface of the n-type semiconductor layer 303, and with a second electrode 32 on the surface of the p-type semiconductor layer 305. As stated above, the first and second electrodes 31 and 32 in the LED chip 3 are disposed on a side of a first surface, in a thickness direction, of the LED chip 3. In the example of FIG. 4, the first surface of the LED chip 3 includes the exposed surface of the n-type semiconductor layer 303 and the surface of the p-type semiconductor layer 305. The first and second electrodes 31 and 32 in the LED chip 3 constitute negative and positive electrodes, respectively. In short, the first and second electrodes 31 and 32 in the LED chip 3 constitute electrodes of which respective polarity are different from each other.

In the example of FIG. 4B, the LED chip 3 is formed with a DBR (Distributed Bragg Reflector) 308 on a rear surface of the substrate 301. The DBR 308 is designed to reflect light from the light-emitting layer 304.

In the example of FIG. 4B, the LED chip 3 has a rectangular shape in planar view. The "shape in planar view of the LED chip 3" is a peripheral shape of the LED chip 3 seen from one side of a thickness direction of the substrate 301 (in the example of FIG. 4B, an upper side), and the same as a peripheral shape of the substrate 301.

For example, the mount substrate 2 is a substrate on which (at least) one LED chip 3 is mounted. In the embodiment, "mount" is used as a term including arrangement, mechanical connection and electrical connection of the LED chip 3.

As shown in an example of FIG. 1B, the mount substrate 2 is configured to allow LED chips 3 to be mounted on. The LED module 1 with the mount substrate 2 (see FIGS. 3A, 3B, 4A and 4B) can therefore have an increased light output. Electrical connection of the LED chips 3 used in the LED module 1 is series connection of the LED chips 3. The connection conductors 21 in the mount substrate 2 are formed into a pattern based on a predetermined connection of the LED chips 3. The connection conductors 21 includes: first connection conductors 22 respectively connected with first electrodes 31 of the LED chips 3; second connection conductors 23 respectively connected with second electrodes 32 of the LED chips 3; and a third connection conductor 27 and a fourth connection conductor 28 as terminals. In the mount substrate 2, the copper foil 211 of a first connection conductor 22 and the copper foil 211 of a second connection conductor 23 between each two adjoining chip mounted regions 263 in planar view are continued and electrically connected. The copper foil 211 of the third connection conductor 27 and the copper foil 211 of the first connection conductor 22 adjacent to the third connection conductor 27 in planar view are continued and electrically connected. The copper foil 211 of the fourth connection conductor 28 and the copper foil 211 of the second connection conductor 23 adjacent to the fourth connection conductor 28 in planar view are continued and electrically connected. The LED chips 3 of the LED module 1 can be lit by supplying electricity from an external power supply device or the like between the third and fourth connection conductors 27 and 28.

As shown in an example of FIGS. 2A and 2B, the mount substrate 2 includes a conductor 24 that is formed to surround the connection conductors 21. The conductor 24 is formed of a copper foil 211. The conductor 24 is formed into a pattern containing the chip mounted regions 263 for the LED chips 3 on the second white resist layer 26 in planar view. As a result, heat dissipation of the mount substrate 2 can be improved.

In the example, the mount substrate 2 has an elongated shape. A shape of the mount substrate 2 in planar view is a long and thin rectangle. The "shape of the mount substrate 2 in planar view" means a peripheral shape of the mount substrate 2 seen from one side of a thickness direction of the mount substrate 2 (in the example of FIG. 2B, an upper side).

In addition, the mount substrate 2 includes a printed wiring board 29 including the insulation substrate 20, the connection conductors 21 and the conductor 24. The first white resist layer 25 is formed on a surface of the printed wiring board 29 and has an opening 251, and the second white resist layer 26 is formed on the first white resist layer 25 and has an opening 261.

A plating layer 212 is stacked on a surface of the copper foil 211 on a region, not covered with the first white resist layer 25, in each of the connection conductors 21. For example, each plating layer 212 can be formed by electroless plating.

In an example, the plating layers 212 have a stack structure of a Ni layer, a Pd layer and an Au layer. The plating layers 212 may have, for example, a stack structure of a Ni layer and an Au layer. Preferably the plating layers 212 are formed so that a top surface thereof is an Au layer. As a result, the mount substrate 2 can have oxidation-resistant, corrosion-resistant and sulfuration-resistant characteristics improved in comparison with a case where a top surface of each of the plating layers 212 is formed of an Ag layer or a case where the plating layers 212 are not provided.

In an example, the printed wiring board 29 is formed of glass fabric/glass nonwoven fabric base material epoxy resin copper clad laminate in conformity with a standard of CEM-3 (Composite Epoxy Materials-3). The insulation substrate 20 accordingly contains resin and glass as stated above. As a result, thermal conductivity of the insulation substrate 20 can be improved. Preferably the insulation substrate 20 has thermal conductivity of 1 W/m·K or more, for example. More preferably the insulation substrate 20 is a resin substrate (an organic substrate). The resin substrate contains resin as a main component, and includes a base material formed of glass as a base material to be a core when the resin substrate is shaped like a board. Examples of the resin include epoxy resin, polyimide resin and the like. Examples of the base material include glass fabric, glass nonwoven fabric and the like. The copper foils 211 of the connection conductors 21 and the conductor 24 are formed by patterning copper foil of the glass fabric/glass nonwoven fabric base material epoxy resin copper clad laminate.

In the example of FIGS. 2A and 2B, the first white resist layer 25 covers the conductor 24 and a region without a plating layer 212 of each of the connection conductors 21, on a side of the surface 201 of the insulation substrate 20.

In addition, the second white resist layer 26 covers the first white resist layer 25 on the side of the surface 201 of the insulation substrate 20.

Preferably the second white resist layer 26 covers a whole periphery of a plating layer 212 on each of the connection conductors 21. In the mount substrate 2, it is accordingly possible to surely prevent the copper foils 211 from being exposed between each plating layer 212 and an inner face of a corresponding first opening 251 in the first white resist layer 25. The reliability of the mount substrate 2 can be further improved.

Preferably in the mount substrate 2, the first white resist layer 25 is formed of an epoxy resin white resist, and the second white resist layer 26 is formed of a fluorine resin white resist. The mount substrate 2 can accordingly have improved reliability and improved weather resistance. The mount substrate 2 can have improved weather resistance and suppressed degradation with time of reflectivity in comparison with a case where the second white resist layer 26 is formed of an epoxy resin white resist or a silicone resin white resist. With the mount substrate 2, the reflectivity of the second white resist layer 26 can be more increased than the reflectivity of the first white resist layer 25. The "epoxy resin" means epoxy resin or modified epoxy resin. The "fluorine resin" means fluorine resin or modified fluorine resin. The "silicone resin" means silicone resin or modified silicone resin.

In a case where material of the first white resist layer 25 is an epoxy resin white resist or a silicone resin white resist, the first white resist layer 25 can be formed by an application method and photo lithography technology. With the mount substrate 2, it is therefore possible to improve shape precision of each first opening 251 in the first white resist layer 25.

In a case where material of the second white resist layer 26 is a fluorine resin white resist, the second white resist layer 26 can be formed by a printing method. Examples of the printing method include a screen printing method and the like.

The material of the first white resist layer 25 is not limited to the epoxy resin white resist, but may be a silicone resin white resist. Preferably the epoxy resin white resist and the silicone resin white resist contain nitride or oxide as white pigment. In the mount substrate 2, when the white pigment is nitride, the thermal conductivity of the first white resist layer 25 can be improved in comparison with a case where the white pigment is oxide. Examples of the nitride include boron nitride, aluminum nitride and the like. Examples of the oxide include titanium dioxide and the like.

Preferably the fluorine resin white resist contains nitride as white pigment. In the mount substrate 2, when the white pigment is nitride, the thermal conductivity of the second white resist layer 26 can be improved in comparison with a case where the white pigment is oxide.

The mount substrate 2 may include a conductor on a rear surface 202 of the insulation substrate 20. Accordingly, warp of the mount substrate 2 can be suppressed. With the mount substrate 2, it is possible to reduce stress to be transmitted from the insulation substrate 20 to the connection conductors 21, the conductor 24, the first white resist layer 25 and the second white resist layer 26. As a result, the reliability of the mount substrate 2 can be improved.

In the embodiment, as shown in FIGS. 3A, 3B, 4A and 4B, the LED module 1 includes a mount substrate 2 and (at least an) LED chips 3 mounted on the mount substrate 2. In the example of FIG. 4B, an LED chip 3 includes first and second electrodes 31 and 32, and the first and second electrodes 31 and 32 are disposed on a side of a first surface, in a thickness direction, of the LED chip 3. The LED chip 3 is adhered to the mount substrate 2 via an adhesion layer 5 so that a second surface, in the thickness direction, of the LED chip 3 is at a side of a second white resist layer 26 of the mount substrate 2. The first electrode 31 is electrically connected, via a first wire 41, to a first connection conductor 22 of connection conductors 21 of the mount substrate 2. The second electrode 32 is electrically connected, via a second wire 42, to a second connection conductor 23 of the connection conductors 21 of the mount substrate 2. The LED module 1 can accordingly have improved reliability.

In the examples of FIGS. 3B and 4B, the LED module 1 further includes a sealant (a sealing member) 6 that covers the LED chips 3, the first wires 41 and the second wires 42 on a side of a surface 200 of the mount substrate 2. The sealant 6 is configured to allow light emitted from the LED chips 3 to pass through. It is accordingly possible to improve the reliability of the LED module 1. The sealant 6 has a function that seals and protects the LED chips 3 and the first and second wires 41 and 42. The sealant 6 has electric insulation. The examples of FIGS. 1B and 2B schematically show a first wire(s) 41 and a second wire(s) 42.

Components, except for the mount substrate 2 and the LED chips 3, of the LED module 1 will be hereinafter explained in details with reference to FIGS. 3A, 3B, 4A and 4B.

Preferably, material of each adhesion layer 5 is optically-transparent material, and the optically-transparent material is material having high transmissivity with respect to visible light. Material of each adhesion layer 5 is silicone resin, for example. Examples of the silicone resin include thermosetting silicone resin, two-part silicone (two-part curing silicone resin), photo-curable silicone (photo-curing silicone resin), and the like.

Preferably each of the first and second wires 41 and 42 is formed of a gold wire. Accordingly, the reliability of the LED module 1 can be improved in comparison with a case where each of the first and second wires 41 and 42 is an aluminum wire, for example.

In the examples of FIGS. 3B and 4B, the sealant 6 is formed of optically-transparent material. The optically-transparent material is silicone resin, for example. The optically-transparent material is not limited to the silicone resin, but may be fluorine resin, low melting point glass, sol-gel glass or the like. Preferably the optically-transparent material is material having high transmittance with respect to visible light.

In an example, the sealant 6 contains phosphor particles to be excited by light emitted from the LED chips 3 to emit light. In other words, the sealant 6 contains the phosphor particles as wavelength conversion material for performing wavelength conversion of part of light emitted from the LED chips 3 to radiate light having different wavelengths. With the LED module 1, it is according possible to obtain (color) mixing light of light emitted from the LED chips 3 (hereinafter referred to as "first light") and light radiated from the phosphor particles (hereinafter referred to as "second light"). Light source color of the LED module 1 is color of the mixing light of the first light and the second light. The phosphor particles are to be excited by the first light to radiate the second light having longer wavelengths than (a) wavelengths of the first light. In an example, the phosphor particles are yellow phosphor particles that radiate yellow light as the second light. Preferably the yellow phosphor particles have emission spectrum in which a main emission peak has a wavelength in a wavelength region of 530 nm to 580 nm, for example. Composition of the yellow phosphor particles is e.g., $SrSi_2O_2N_2$ activated by Eu, or the like.

Preferably when the LED module 1 is used for general lighting source, the light source color of the LED module 1 is set based on correlated color temperature of LED light source color defined by JIS Z9112:2012, for example. In JIS Z9112:2012, the LED light source color is divided into five kinds of daylight color, neutral white color, white color, warm white color and light bulb color according to chromaticity in XYZ colorimetric system.

The LED module 1 can be employed as a light source for various lighting apparatus. Examples of the lighting apparatus include a straight type LED lamp, a bulb type LED lamp, light fixture and the like. Preferably the straight type LED lamp conforms to a standard of "straight type LED lamp system with L-shaped pin base GX16t-5 (for general illumination)" (JEL 801:2010) prescribed by Japan Electric Lamp Manufacturers Association, for example.

Preferably the sealant 6 is shaped like a lens. The LED module 1 can accordingly have improved light out-coupling efficiency. In an example, the sealant 6 is shaped like a cylindrical lens. With the LED module 1, it is possible to improve the light out-coupling efficiency and suppress color irregularity. The "color irregularity" is a state in which chromaticity varies according to light emission directions. The sealant 6 has a linear shape in planar view when it is shaped like the cylindrical lens.

In production of the LED module 1, first a printed wiring board 29 is prepared, and first, second, third, fourth and fifth processes are carried out sequentially.

In the first process, a first white resist layer 25 is formed on a surface of the printed wiring board 29. The first white resist layer 25 is formed by the application method or the photo lithography technology.

In the second process, a second white resist layer 26 is formed on the first white resist layer 25 by the printing method.

In the third process, LED chips 3 as dies are adhered to the chip mounted regions 263 of a mount substrate 2 via adhesion layers 5 with a die bond device or the like.

In the fourth process, first and second electrode 31 and 32 of each LED chip 3 are electrically connected to corresponding first and second connection conductors 22 and 23 via first and second wires 41 and 42 through a wire bonding machine or the like, respectively. In short, in the fourth process, wire bonding is carried out.

In the fifth process, a sealant 6 is formed through a dispenser system or the like.

With the production method of the LED module 1 as explained above, reliability of the LED module 1 can be improved.

Respective material, numerical values and the like in the embodiment are just preferable examples, and not limited thereto. The embodiment may be modified suitably.

For example, a shape of the mount substrate 2 in planar view is not limited to a long and thin rectangle, but may be shaped like a rectangle, a square, a circle or the like.

The substrate 301 of each LED chip 3 is not limited to a sapphire substrate, but may be a GaN substrate. A multilayer 306 of each LED chip 3 may have structure in which a p-type semiconductor layer 305, a light-emitting layer 304 and an n-type semiconductor layer 303 are stacked from a side near to a surface of a substrate 301. The multilayer 306 may have structure in which an n-type semiconductor layer 303 and a p-type semiconductor layer 305 are stacked. Each LED chip 3 may have structure in which a DBR 308 is not provided on a rear surface of a substrate 301 thereof.

In the LED module 1, connection of the LED chips 3 may be, for example, series-parallel connection of the LED chips 3, or parallel connection of the LED chips 3.

The LED module 1 is configured so that only one LED chip 3 is mounted on the mount substrate 2. A shape of the mount substrate 2 in planar view may be modified according to the number of the LED chips 3 and arrangement thereof. A shape of the sealant 6 may be modified according to the number of the LED chips 3 and arrangement thereof.

The phosphor particles are not limited to yellow phosphor particles, but may be, for example, yellowish green phosphor particles that radiate yellowish green light, green phosphor particles that radiate green light, red phosphor particles that radiate red light, or the like.

Preferable the yellowish green phosphor particles have emission spectrum in which a main emission peak has a wavelength in a wavelength region of 530 nm to 550 nm, for example. Composition of the yellowish green phosphor particles is e.g., YAG (Yttrium Aluminum Garnet) activated by Ce.

Preferable green phosphor particles have emission spectrum in which a main emission peak has a wavelength in a wavelength region of 490 nm to 540 nm, for example.

Composition of the green phosphor particles is e.g., $CaSc_2O_4$ activated by Ce, $Ca_3Sc_2Si_3O_{12}$ activated by Ce, (Ca, Sr, Ba)$Al_2O_4$ activated by Eu, $SrGa_2S_4$ activated by Eu, or the like.

The red phosphor particles have emission spectrum in which a main emission peak has a wavelength in a wavelength region of 600 nm to 670 nm, for example. Composition of the red phosphor particles is e.g., $CaAlSiN_3$ activated by Eu, (Sr, Ca)$AlSiN_3$ activated by Eu, or the like. In short, CASN, SCASN or the like may be employed as the red phosphor particles, for example.

Each adhesion layer 5 of the LED module 1 may contain phosphor particles to be excited by light emitted from (an) LED chips 3 to emit light. The phosphor particles of the adhesion layer 5 may be the same as or different from the phosphor particles of the sealant 6.

The invention claimed is:

1. A mount substrate, configured to allow an LED chip to be mounted on, comprising:
   an insulation substrate;
   a connection conductor formed on a surface of the insulation substrate;
   a first white resist layer that covers the connection conductor, the first white resist layer having a first opening, a part of the connection conductor being exposed in the first opening; and
   a second white resist layer that covers the first white resist layer, the second white resist layer having a second opening inside the first opening,
   wherein
   the connection conductor comprises a copper foil and a plating layer formed inside the first opening on the copper foil,
   the plating layer is metal having oxidation-resistant and corrosion-resistant characteristics higher than those of copper,
   an outer edge of the plating layer is covered with an inner edge of the second white resist layer forming the second opening in planar view,
   the first white resist layer is formed of a white resist of epoxy resin, and
   the second white resist layer is formed of a white resist of fluorine resin.

2. The mount substrate of claim 1, wherein the second white resist layer covers a whole outer edge of the plating layer in planar view.

3. An LED module, comprising:
   the mount substrate of claim 1; and
   the LED chip mounted on the mount substrate, wherein
   the LED chip includes an electrode,
   the LED chip is adhered to the second white resist layer of the mount substrate via an adhesion layer, and
   the electrode is electrically connected to the plating layer by a metal wire.

4. The LED module of claim 3, further comprising a sealant that covers the LED chip, wherein the sealant is configured to allow light emitted from the LED chip to pass through.

5. The LED module of claim 4, wherein the sealant contains phosphor particles which emit light when excited by light emitted from the LED chip.

6. The mount substrate of claim 1, wherein the first white resist layer directly contacts the second white resist layer.

* * * * *